United States Patent
Slavin

(10) Patent No.: US 7,348,908 B2
(45) Date of Patent: Mar. 25, 2008

(54) LINEARITY CORRECTOR USING FILTER PRODUCTS

(75) Inventor: Keith R. Slavin, Beaverton, OR (US)

(73) Assignee: Tektronix, Inc., Beaverton, OR (US)

(*) Notice: Subject to any disclaimer, the term of this patent is extended or adjusted under 35 U.S.C. 154(b) by 109 days.

(21) Appl. No.: 11/258,030

(22) Filed: Oct. 26, 2005

(65) Prior Publication Data
US 2006/0092057 A1   May 4, 2006

Related U.S. Application Data

(60) Provisional application No. 60/625,372, filed on Nov. 4, 2004.

(51) Int. Cl.
*H03M 1/88* (2006.01)
(52) U.S. Cl. ...................... 341/140; 341/155
(58) Field of Classification Search ......... 341/118–170
See application file for complete search history.

(56) References Cited

U.S. PATENT DOCUMENTS

| | | | |
|---|---|---|---|
| 5,594,612 A | 1/1997 | Henrion | |
| 6,570,514 B1 * | 5/2003 | Velazquez | 341/118 |
| 6,639,537 B1 | 10/2003 | Raz | |
| 6,911,925 B1 * | 6/2005 | Slavin | 341/120 |

OTHER PUBLICATIONS

Taiho Koh et al, "Second-Order Volterra Filtering and Its Application to Nonlinear System Identification", IEEE Transactions vol. ASSP-33 No. 6, Dec. 1985.
Zhang Jia-Shu et al "A Reduced Parameter Second-Order Volterra Filter with Application to Nonlinear Adaptive Prediction of Chaotic Time Series" Chin. Phys Soc vol. 50 Jul. 2001.
Walter Frank, "Compensation of Linear & Nonlinear Sensor Distortions by Digital Post Processing", (Sensor 95) pp. 889-892, 1995.
Walter Frank et al, "Realtime Loudspeaker Linearization", IEEE Winter Workshop 1993.
Konstantina Karagianni et al, "Efficient Third-Order Volterra Filter Computation in the Time Domain", IEEE U.S., Nov. 2003.

* cited by examiner

*Primary Examiner*—Lam T. Mai
(74) *Attorney, Agent, or Firm*—Matthew D. Rabdau

(57) ABSTRACT

A linearity corrector is provided that reduces distortion in a signal processing system, such as an ADC. The linearity corrector provides a first order signal path having distortion components connected to an adder, and a filter product circuit that is also connected to the adder. A method is provided for reducing distortion by calculating a filter product and adding the filter product to a first order signal having a relative delay such that the filter product reduces, or eliminates, the order of distortions corresponding to the order of the filter product.

17 Claims, 6 Drawing Sheets

LINEARITY CORRECTOR USING FILTER PRODUCTS

CROSS-REFERENCE

This application claims the benefit of U.S. provisional application No. 60/625,372 filed Nov. 4, 2004.

BACKGROUND OF THE INVENTION

The present invention relates to linearity error correction, and more particularly to a linearity corrector using filter products to reduce, or eliminate, distortion generated by signal processing systems, such as an analog to digital converter (ADC).

Reducing distortion produced by ADCs increases the spurious-free dynamic range (SFDR), which is useful for systems that use ADCs to acquire data, such as spectrum analyzers, and other electronic measurement instruments.

Modern high-speed ADC designs use a deep clock pipeline to help accurately convert an analog input to a sampled digital representation in a series of refining steps. The ADC designers make significant efforts to remove obvious sources of nonlinearities in the analog processing circuits. However, it is typically difficult to remove all sources of errors. Designers tend to remove the most obvious problems of the circuit until computerized modeling, for example SPICE modeling, shows that the converter meets specifications. Linearity can be improved using techniques such as reducing dynamic range at the nonlinear device, or using feedback around it. However, some circuit topologies have inherent distortion mechanisms that cannot be completely removed.

Pipelined processing also provides opportunities for internal digital and analog circuit activity to modulate the processing of internal analog signals. In many such cases, the residual nonlinear distortion is generated by self-modulation of the input signal with a linear function of itself or its own derivative. This results in some lower level distortions that are hard to eliminate. Such modulation could occur via the internal power supply distribution. In this case, the number of circuit paths that can generate voltage modulation on the power supply rails may be quite high. Simulating these effects complicates device modeling, and slows computerized simulations. To first order, these contributions to power supply modulation will add almost linearly, so they can be modeled as a linear finite impulse response (FIR) filter.

At one, or more, points in analog signal processing, modulation occurs, which corresponds to a multiplication. In pipelined ADCs, modulation typically occurs in the high gain analog amplifiers between conversion stages. In this situation, the harmonic and intermodulation distortion is typically characterized by the presence of $2^{nd}$ and $3^{rd}$ order distortion terms, with very little higher-order distortion occurring.

Previous proposed solutions have been based on Volterra Filters. The impulse response of ADCs can be many clock periods, for example 64 clock periods may be used. The correcting system using Volterra Filters would require a similar response length. In a $3^{rd}$-order distortion Volterra system this results in a filter of on the order of $(N^3)/6$ taps, which for a correcting system having a response length of 64 would result in on the order of about 50,000 taps. A filter system with such a large number of taps is too complex and expensive to implement in a practical system at this time.

Another solution has been proposed elsewhere for use in connection with correcting distortion in loud speakers, which utilizes a filter structure that approximates certain aspects of a Volterra filter. FIG. 1 illustrates a version of this solution having a $1^{st}$ order correction and a $3^{rd}$ order correction. The first order compensation is provided by filter 12 ($h_1$). The $3^{rd}$ order compensation is provided by multiplying the output of filter 14 and the output of filter 16 using the multiplier 18, filtering the output from the multiplier 18 using filter 20, multiplying the output of filter 20 with the output of filter 22 using multiplier 24 and finally filtering the output of the multiplier 24 using filter 26. By summing the output from the first order compensation with the third order compensation using adder 28, a linear cubic compensation may be provided. The $3^{rd}$ order compensation of the system shown in FIG. 1 implements the following equation, $$y(n) = \sum_{i=0}^{N_p-1} h_p(i) \sum_{j=0}^{N_a+N_m-2} h_3(j)x(n-i-j)$$

$$\sum_{k=0}^{N_m-1} h_m(k) \cdot \sum_{l=0}^{N_a-1} h_1(l)x(n-l-k-i) \sum_{m=0}^{N_a-1} h_2(m)x(n-m-k-i)$$

which is a described as a general $3^{rd}$ order nonlinear filter structure. This implementation utilizes filter 20 after multiplier 18, and filter 26 after multiplier 24. Once the linear cubic compensation is obtained, it is subtracted from the output of the unknown system that is being compensated. This requires that the corrector have access to the original signal that was input into the unknown system, which is not available where the original signal is not digital. While it may be a useful subcase of a Volterra filter, it has drawbacks that make it unsuitable for systems with a good linear frequency response. The filters following the multipliers cannot distinguish between original components and aliased components caused by the nonlinear effects of the prior multiplications. While additional filtering following the multiplier may provide some correction for frequency-dependent amplitude and phase responses in signal paths, aliasing does not allow the filter to correct for differences in phase and amplitude response between the original and aliased components when used in applications that use most of a Nyquist band.

A remaining problem in linearity compensation systems relates to calibration. These systems may require solving for systems of filter coefficients that are nonlinear with respect to the output. Solving for more coefficients requires more computation for any calibration scheme that can be applied to the system.

The details and improvements over the prior solutions will be discussed in greater detail below.

SUMMARY OF THE INVENTION

Accordingly, ADC linear correctors using filter products are provided. Embodiments of the present ADC linear correctors can be implemented using far fewer filter taps than systems based upon general purpose Volterra filter systems.

Accordingly, if the distortion mechanisms can be modeled by recovering the coefficients of the equivalent distorting filters in the ADC, the ADC output can be passed through a digital processing network that distorts the signal in substantially the same way, and then subtracts the distortion to reduce, or eliminate, the ADC distortion. Although complete elimination of all the ADC distortion is not possible, this method improves the spurious-free dynamic range (SFDR)

of an ADC. For example, an ADC with an SFDR of 80 dB may be improved by a factor of 15 dB, depending upon the ADC characteristics. This improvement also removes some filters from prior proposed topologies, thereby simplifying the design for use with systems that have a relatively flat linear frequency response. This simplification can be traded off for longer filters in the correction system, thereby obtaining improved performance with the same amount of processing. The improvement is significant for precision measurement applications, such as those associated with spectrum analyzers, oscilloscopes, or other measurement instruments that use ADCs.

A linearity corrector is provided having a first order signal path for passing a first order signal having higher order distortion, an $n^{th}$ order filter product circuit, where n is an integer greater than 1, providing a compensating signal having a delay relative to the first order signal path, and an adder connected to the first signal path and directly connected to the $n^{th}$ order filter product circuit such that the compensating signal reduces the corresponding distortion terms in the first order signal.

Also provided is a method of compensation. The method of compensation provides a filter product that is simply summed with a relative delay to a first order signal path such that distortion components in an original output from an ADC are reduced, or eliminated.

DETAILED DESCRIPTION OF THE INVENTION

Figure 1:
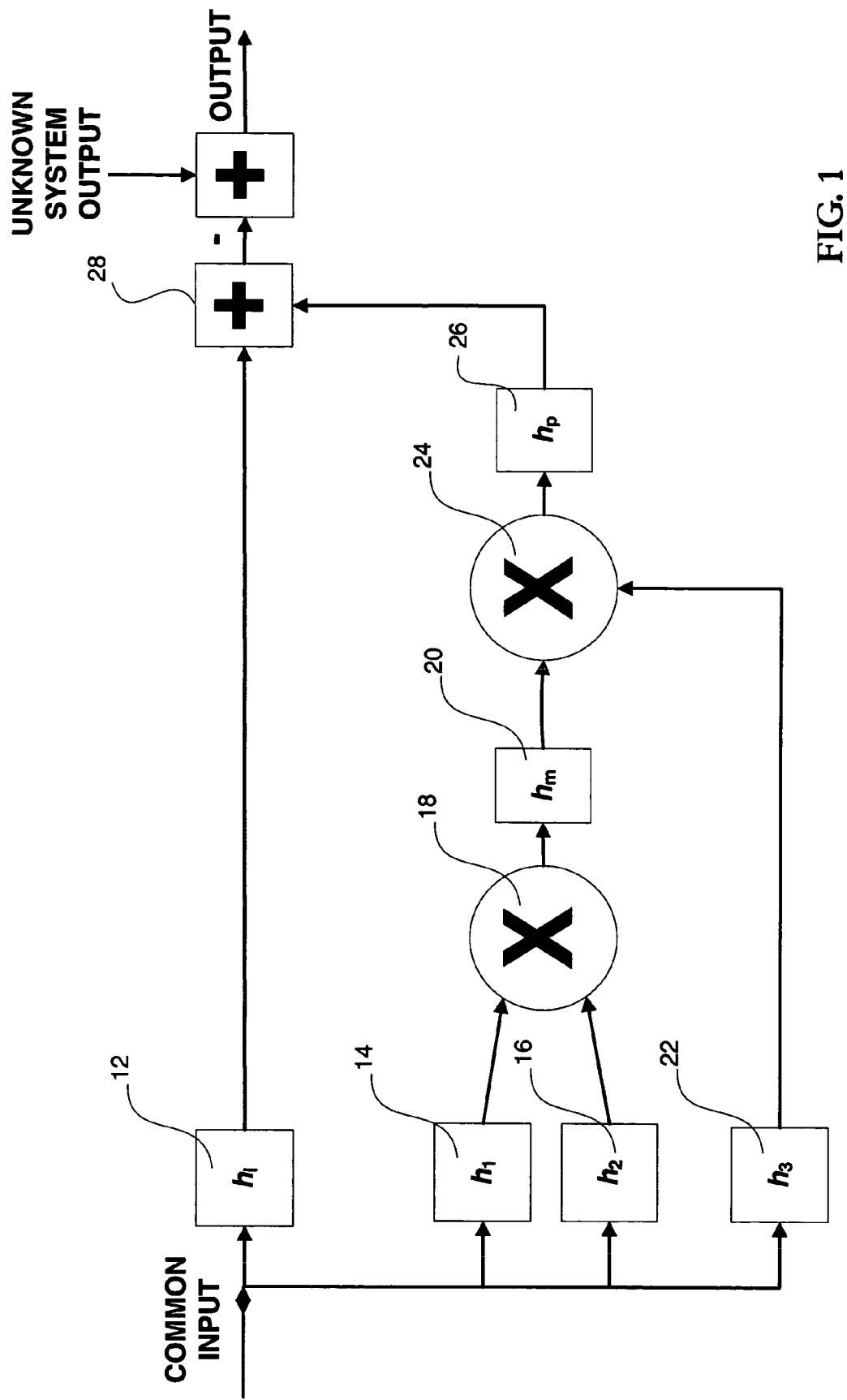
FIG. 1 (PRIOR ART) is a block diagram of a prior art linearity corrector arrangement for compensating loud speakers.

As was mentioned above, previous proposed solutions have been based on Volterra filters. However, since Volterra filters would be very large and difficult to implement in connection with ADCs, a solution that will utilize a more manageable filter design, while still reducing some of the remaining dominant distortions, would be desirable. Taking the Volterra filter as a starting point, the generalized non-linear filter system can be defined mathematically as:

$$y(t) = h_0 + \sum_{k=1}^{n}\left(\sum_{j_1=0}^{N-1}\sum_{j_2=0}^{N-1}\cdots\sum_{j_k=0}^{N-1} h_{j_1,j_2,\ldots,j_k} \prod_{i=1}^{k} x(t-j_i)\right) \quad \text{(Eq. 1)}$$

where N is the impulse response length of the filter, and k is the filter order index.

For example, if n=3, then we have the sum of a DC value ($h_0$), a linear FIR filter term at k=1, a $2^{nd}$-order distortion filter at k=2, and a $3^{rd}$-order filter at k=3. Accordingly, for n=3, the Volterra filter can be expressed as:

$$y(t) = h_0 + \sum_{j_1=0}^{N-1} h_{j_1} x(t-j_1) + \sum_{j_1=0}^{N-1}\sum_{j_2=0}^{N-1} h_{j_1,j_2} x(t-j_1)x(t-j_2) + \quad \text{(Eq. 2)}$$

$$\sum_{j_1=0}^{N-1}\sum_{j_2=0}^{N-1}\sum_{j_3=0}^{N-1} h_{j_1,j_2,j_3} x(t-j_1)x(t-j_2)x(t-j_3)$$

Volterra filter coefficients are linear with output y, so a set of h can, in theory, be found with training data. Some of the product terms are just permutations of the same sets of input samples, so the number of distinct values, which correspond to the number of filter taps, in the set of h for each order index k is actually given by:

$$\text{Taps}(k) = \binom{N+k-1}{N-1} = \frac{\prod_{j=1}^{k}(N+k-j)}{k!} \geq \frac{N^k}{k!} \quad \text{(Eq. 3)}$$

Unfortunately, the impulse response of a pipelined ADC system may be quite large, so N may be large, yielding a very large number of taps for k=3. For example, if the impulse response of the pipelined ADC system were 64 clock periods, such that N=64, then the number of taps required would be approximately 44,000. Additional taps will be required for other order filters, if any.

Embodiments of the present ADC linearity corrector rely on a subset of a Volterra filter system. This subset of the Volterra filter system can be characterized by:

$$y(t) = \sum_{k=1}^{n}\left(\prod_{j=1}^{k}\left(\sum_{i=0}^{N-1} h_{k,j,i} x(t-i)\right)\right) \quad \text{(Eq. 4)}$$

The system order n defines a set of product orders k for $1 \leq k \leq n$.

It is assumed that the distortion model is of this form, although the number and values of the taps is unknown. The correction model has the same form, except that the order, and filter lengths are chosen beforehand, based on experimentation with a particular ADC architecture. Calibration then involves finding the filter taps. Note that the filter taps will, in general, be different for each filter. For system order n=3, and ignoring the $h_0$ (DC) term, we get:

$$y(t) = \sum_{i=0}^{N-1} h_{1,1,i} x(t-i) + \left(\sum_{i=0}^{N-1} h_{2,1,i} x(t-i)\right)\left(\sum_{i=0}^{N-1} h_{2,2,i} x(t-i)\right) + \quad \text{(Eq. 5)}$$

$$\left(\sum_{i=0}^{N-1} h_{3,1,i} x(t-i)\right)\left(\sum_{i=0}^{N-1} h_{3,2,i} x(t-i)\right)\left(\sum_{i=0}^{N-1} h_{3,3,i} x(t-i)\right)$$

Embodiments of this structure may be characterized by products of N-tap filters with each linear convolution implemented using filters.

Figure 2:
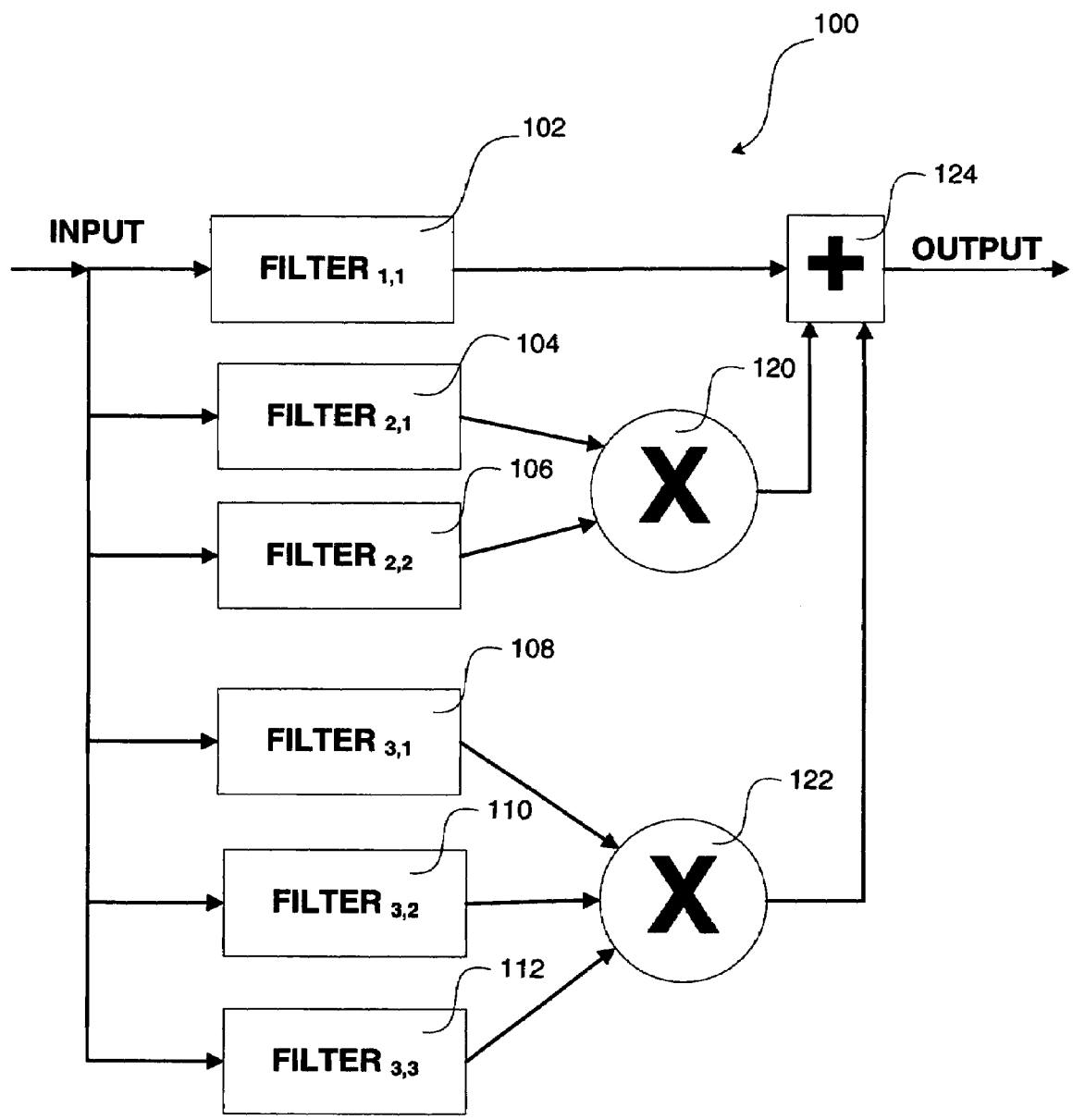
FIG. 2 is a block diagram of a filter product based linearity corrector including compensation for $1^{st}$, $2^{nd}$, and $3^{rd}$ order distortions.

FIG. 2 illustrates an embodiment of a linearity corrector 100 for implementing Eq. 5. The output of a signal processing system, such as an ADC, is provided as the input to the linearity corrector 100. Each of the linear convolutions, as provided in Eq. 5, is implemented using filters 102 through 112. The filters may be implemented as FIR filters. The first order term corresponds to the filter 102. In an alternative embodiment, the first order term is achieved by replacing the filter 102 with a fixed delay equal to approximately half the lengths of the other filters. In another embodiment, the first order term is achieved by replacing the filter 102 with the combination of a fixed delay and a filter, such that the fixed delay plus half the filter length is approximately half the length of the other order filters. The second order term is implemented by multiplying the outputs from filter 104 and filter 106 using a multiplier 120 to produce a $2^{nd}$ order filter product. The third order is implemented by multiplying the outputs from filter 108, filter 110 and filter 112 using multiplier 122 to produce a $3^{rd}$ order filter product. The output from the filter 102 is then added to the output from the multiplier 120 and the multiplier 122 using the adder 124 to provide a simple sum of the filter products as an output. The term simple sum as used herein refers to the operation of adding the multiplier values without additional filtering between the multipliers and the adder 124. This simple sum is achieved by directly connecting the multipliers to the adder. The term directly connecting (or directly connected) as used herein means that there are no filters or other processing elements in the path, there may be registers or other elements in the path that do not change the sample values of the signal data on the path. The output is now a compensated signal with reduced nonlinearities that were produced by the signal processing system, such as an ADC. It should be noted that embodiments of the present invention have eliminated the filters following the multipliers, which were provided in prior art solutions. While this may require filters having additional taps as compared to the prior art shown in FIG. 1, it allows the filters to perform a better job of tracking variations in the ADC as a function of frequency. For example, if the prior art of FIG. 1 uses an all-pass output filter 20 of a half clock period delay (a so-called sin(x)/x or sinc(x) filter), then this half-clock delay can be incorporated into the filters prior to the multiplications. By employing filters only before the multipliers, it is possible for the filter product system to better distinguish correction filter responses between the original components and the aliased components.

While it may reduce the amount of computation by using different length filters in some embodiments, the use of longer length filters may increase the number of variables to solve for during calibration, which tends to slow down the calibration algorithm. For hardware implementations, longer length filters may also require additional delays to match the filter signal delays. Accordingly, in an embodiment of the corrector 100, all of the filter lengths are equal so that no additional delays are needed.

Figure 3:
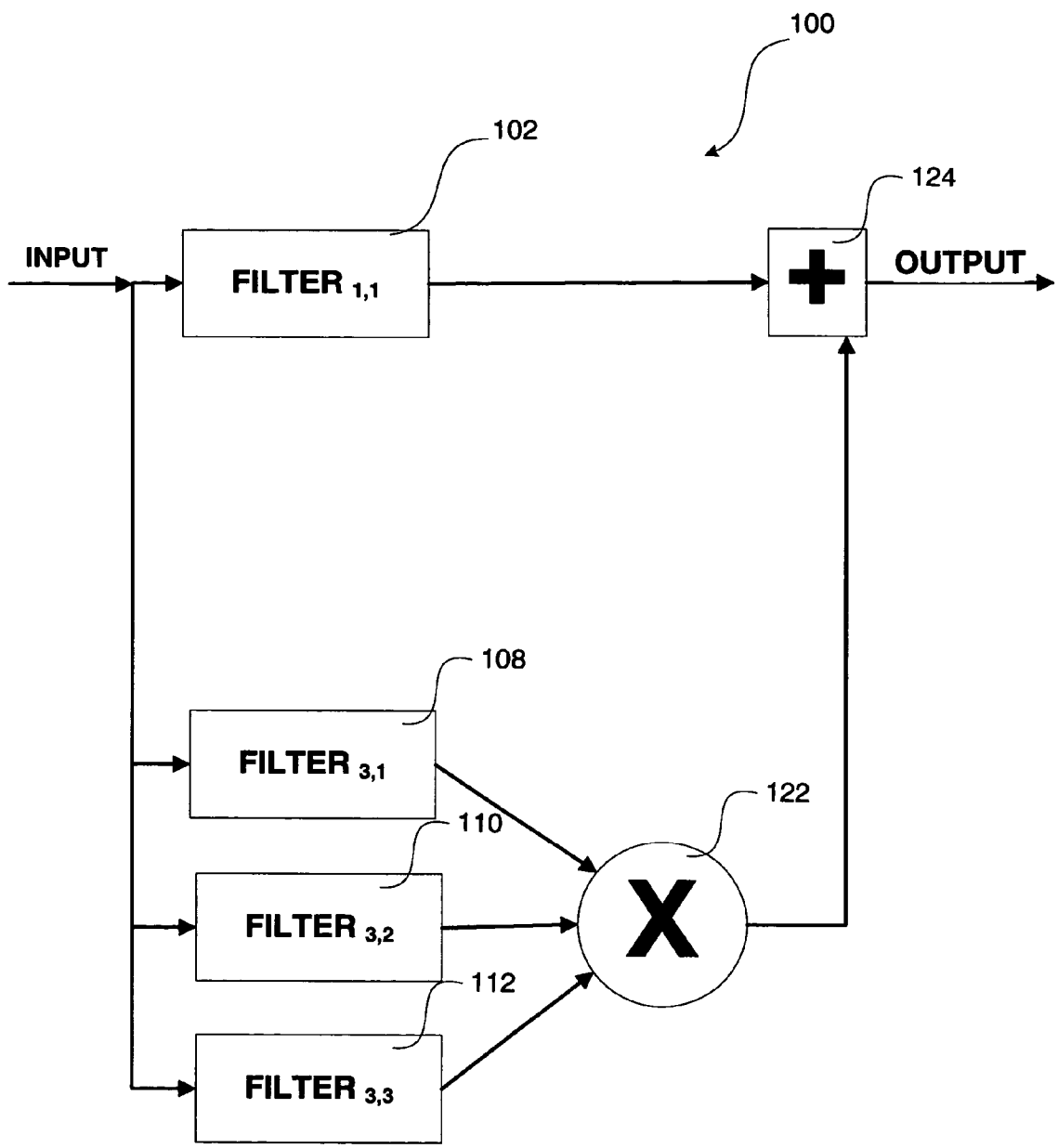
FIG. 3 is a block diagram of a filter product based linearity corrector including compensation for $1^{st}$ and $3^{rd}$ order distortions.

FIG. 3 illustrates an embodiment of a linearity corrector 100 designed to compensate for $1^{st}$ order and $3^{rd}$ order distortion, without compensating for $2^{nd}$ order distortion. In some applications, second order distortion may not be significant enough to justify inclusion of $2^{nd}$ order compensation. As shown in FIG. 3, the $3^{rd}$ order compensation is provided by multiplying the outputs from filter 108, filter 110 and filter 112 using multiplier 122 to produce a $3^{rd}$ order filter product. The simple sum of the $3^{rd}$ order filter product and the first order filter product may then provide a compensated signal having reduced, or eliminated, $1^{st}$ and $3^{rd}$ order distortions.

Figure 4:
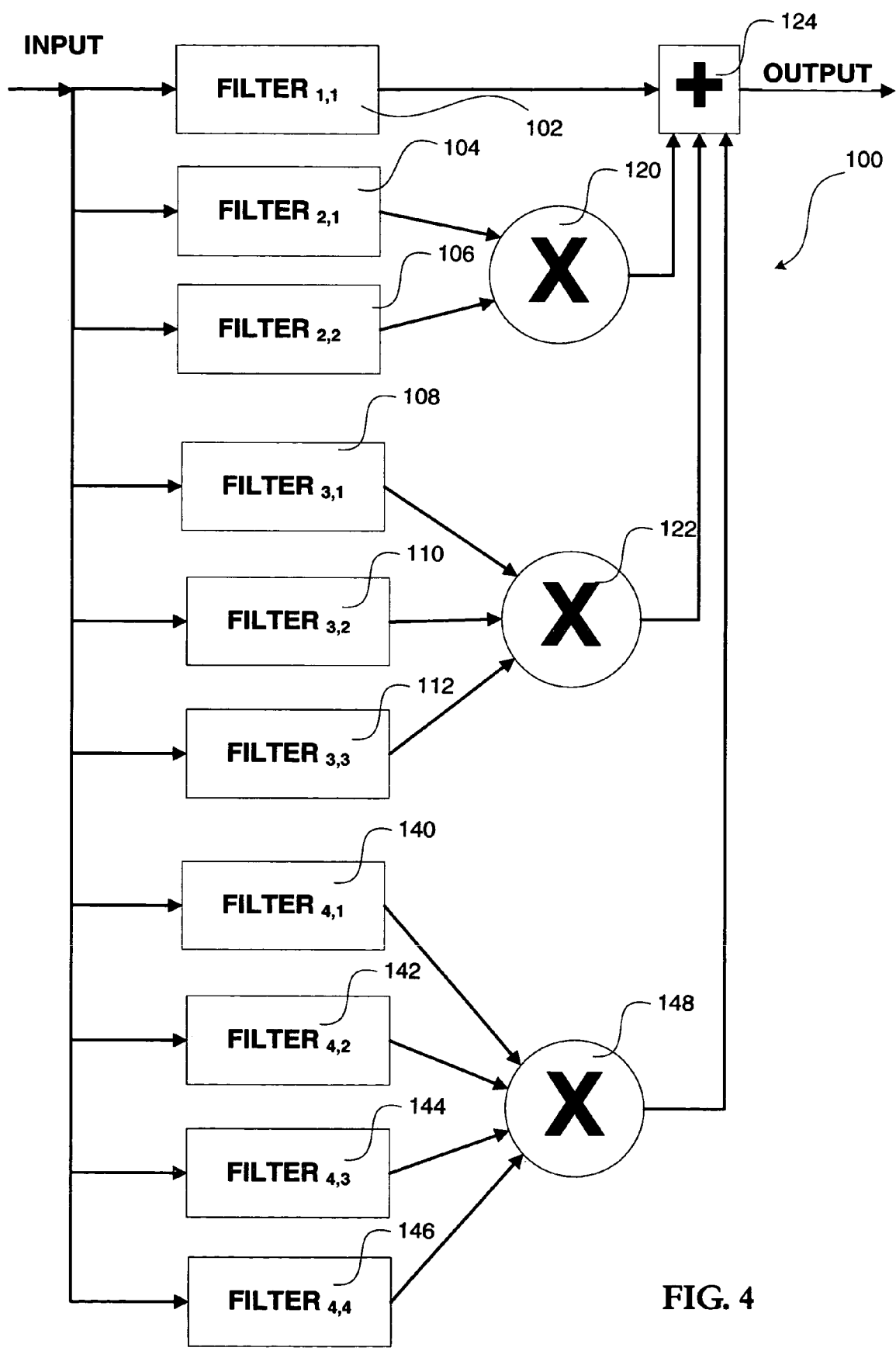
FIG. 4 is a block diagram of a filter product based linearity corrector including compensation for $1^{st}$, $3^{rd}$, and $4^{th}$ order distortions.

As shown in FIG. 4, it is possible to provide an embodiment of the corrector 100 that includes $4^{th}$ order compensation. Taking the general form of Eq. 4, for system order n=4, and ignoring the $h_0$ (DC) term, we get:

$$y(t) = \sum_{i=0}^{N-1} h_{1,1,i} x(t-i) + \left(\sum_{i=0}^{N-1} h_{2,1,i} x(t-i)\right)\left(\sum_{i=0}^{N-1} h_{2,2,i} x(t-i)\right) + \left(\sum_{i=0}^{N-1} h_{3,1,i} x(t-i)\right)\left(\sum_{i=0}^{N-1} h_{3,2,i} x(t-i)\right)\left(\sum_{i=0}^{N-1} h_{3,3,i} x(t-i)\right) + \left(\sum_{i=0}^{N-1} h_{4,1,i} x(t-i)\right)\left(\sum_{i=0}^{N-1} h_{4,2,i} x(t-i)\right)\left(\sum_{i=0}^{N-1} h_{4,3,i} x(t-i)\right)\left(\sum_{i=0}^{N-1} h_{4,4,i} x(t-i)\right)$$ (Eq. 6)

The $4^{th}$ order terms may be implemented, as shown in FIG. 4, by multiplying filter 140, filter 142, filter 144 and filter 146 together using multiplier 148. Again, this filter product is summed directly to the other order compensation using adder 124, without any intervening filters between the multiplier 148 and the adder 124. As would be clear from the preceding example, one of ordinary skill in the art would be able to solve Eq. 4 to place it in a form similar to that of Eq. 5 and Eq. 6 for any desired order, which could then be implemented using the simple sum of filter products as taught generally herein.

Figure 5:
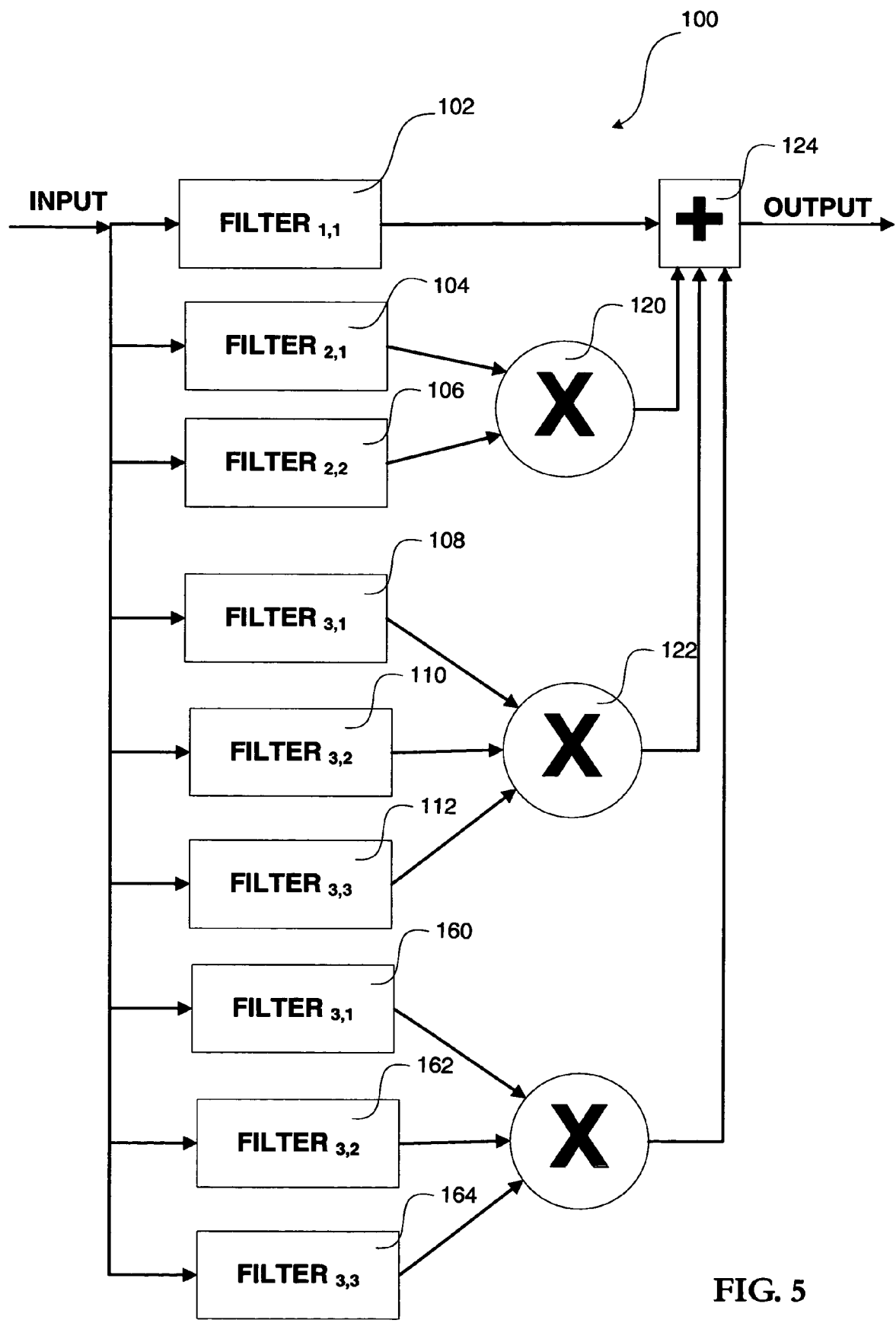
FIG. 5 is a block diagram of a filter product based linearity corrector including compensation for $1^{st}$, $2^{nd}$, $3^{rd}$, and $4^{th}$ order distortions

FIG. 5 shows a filter product system designed to compensate for two $3^{rd}$ order distortions. Since each product order k may only compensate for a single self-modultion mechanism, by providing two $3^{rd}$ order filter products it may be possible to compensate for two $3^{rd}$ order distortions. Accordingly, a second $3^{rd}$ order filter product is obtained by multiplying filter 160, filter 162, and filter 164 using multiplier 166. This second $3^{rd}$ order filter product may then be added to the first $3^{rd}$ order filter product from multiplier 122 using the adder 124.

The justification for the effectiveness of the proposed decomposition of the general Volterra form, and the corresponding filter product structure, lies in the understanding that a single self-modulation mechanism is present for each product order k, and not in the likelihood that any random Volterra filter system can be decomposed in this way.

The various embodiments of the linearity corrector 100 may be implemented using dedicated hardware, such as an FPGA or an ASIC, or using a general purpose processor running software. At the present time, the FPGA or ASIC are useful for performing real-time correction, while software running on a general purpose processor would be useful for post-acquisition correction. In the future, it may be possible to utilize software on a general purpose processor for real-time correction, as well.

Figure 6:
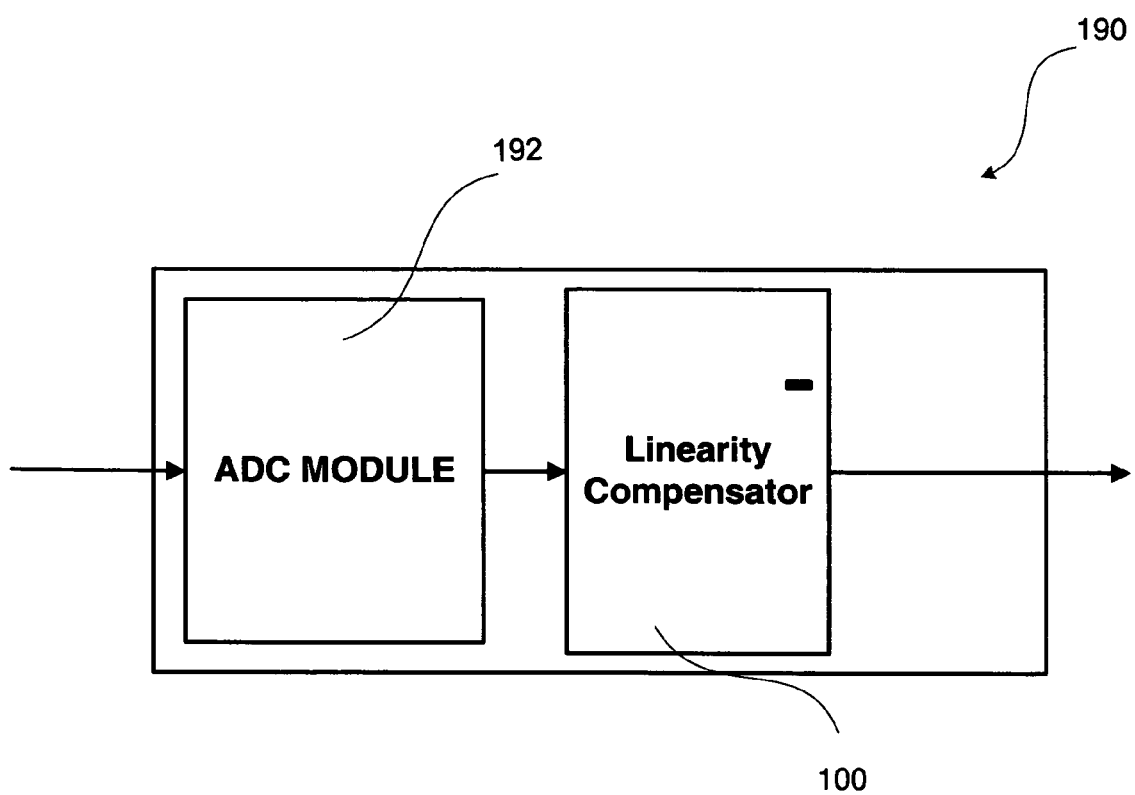
FIG. 6 is a block diagram of compensated ADC.

Although in some embodiments the linearity corrector 100 is used to compensate a signal output from an ADC, in other embodiments the structure of the linearity corrector 100 may be integrated within the same packing, or possibly on the same chip as the ADC, in order to form a compensated ADC. The compensated ADC 190 is shown in FIG. 6. It comprises the ADC module 192, which contains the various circuits to convert an analog signal into a digital signal. The digital output of the ADC module 192 is input into the linearity corrector 100, which may implemented as taught above. The output of the linearity corrector is an output having reduced harmonic and intermodulation distortion. This combined structure provides a corrected ADC.

To properly optimize the linearity correctors described above it will be necessary to calibrate the linearity correctors to determine the appropriate filter coefficients for each of the filters. Unlike the general Volterra filter, the filter product outputs of the correctors shown in FIGS. 2–4 are not linearly related to its coefficients, so computation of the filter coefficients is a nonlinear optimization problem in the general case.

It will be obvious to those having skill in the art that many changes may be made to the details of the above-described embodiments of this invention without departing from the underlying principles thereof. The scope of the present invention should, therefore, be determined by the following claims.

What is claimed is:

1. A linearity corrector comprising:
   a first order signal path providing a first order signal;
   an $n^{th}$ order filter product circuit providing a compensating signal having a delay relative to the first order signal path, where n is an integer greater than one; and
   an adder connected to the first order signal path and directly connected to the nth order filter product circuit, wherein the delay causes the compensating signal to reduce distortion in the first order signal.

2. The linearity corrector of claim 1, wherein the first order signal path comprises a delay circuit equal to half of the length of each filter within the $n^{th}$ order filter product circuit.

3. The linearity corrector of claim 1, wherein the first order signal path comprises an FIR filter.

4. The linearity corrector of claim 1, wherein the $n^{th}$ order filter product circuit comprises n filters each having an output connected to a multiplier, whereby a filter product is output by the multiplier.

5. The linearity corrector of claim 4, wherein the filters are FIR filters.

6. The linearity corrector of claim 1, further comprising a second $n^{th}$ order filter product circuit directly connected to the adder.

7. The linearity corrector of claim 1, further comprising an $m^{th}$ order filter product circuit directly connected to the adder, where n is an even integer and m is an odd integer greater than 1.

8. The linearity corrector of claim 1, further comprising an ADC circuit integrated with the $n^{th}$ order filter product circuit in a common package.

9. The linearity corrector of claim 1, further comprising an ADC circuit integrated with the $n^{th}$ order filter product circuit on a common chip.

10. A linearity corrector comprising:
    a first order path connected to an adder;
    a second order filter product circuit comprising two filters connected in parallel to a first multiplier, wherein the first multiplier has an output directly connected to the adder; and
    a third order filter product circuit comprising three filters connected in parallel to a second multiplier, where in the second multiplier has an output directly connected to the adder.

11. The linearity corrector of claim 10, wherein the first order path comprises a filter.

12. The linearity corrector of claim 11, where the filter is an FIR filter.

13. The linearity corrector of claim 10, wherein the first order path comprises a delay element.

14. The linearity corrector of claim 10, wherein the two filters and the three filters are FIR filters.

15. The linearity corrector of claim 14, wherein the FIR filters are the same length.

16. A method of compensating for non-linearity distortions comprising:
    introducing a signal having distortions;
    passing the signal through a signal path having a predetermined delay to produce a delayed signal;
    determining a first filter product of the signal, wherein the filter product signal is delayed relative to the delayed signal; and
    calculating a simple sum of the first filter product and the delayed signal, wherein distortion components produced by the filter product reduce distortions contained in the delayed signal.

17. The method of claim 16, further comprising determining a second filter product of the signal and calculating a simple sum of the first filter product and the second filter product.

* * * * *